United States Patent [19]

Witowski

[11] Patent Number: 5,352,327
[45] Date of Patent: Oct. 4, 1994

[54] REDUCED TEMPERATURE SUPPRESSION OF VOLATILIZATION OF PHOTOEXCITED HALOGEN REACTION PRODUCTS FROM SURFACE OF SILICON WAFER

[75] Inventor: Robert Witowski, Austin, Tex.

[73] Assignee: Harris Corporation, Melbourne, Fla.

[21] Appl. No.: 911,902

[22] Filed: Jul. 10, 1992

[51] Int. Cl.$^5$ .................. B44C 1/22; H01L 21/302
[52] U.S. Cl. .................. 156/646; 156/643; 437/225; 437/946; 148/DIG. 51
[58] Field of Search .............. 156/646, 643; 437/225, 437/946; 148/DIG. 51

[56] References Cited

U.S. PATENT DOCUMENTS

| | | | |
|---|---|---|---|
| 4,512,391 | 4/1985 | Harra | 165/48 |
| 4,542,298 | 9/1985 | Holden | 250/443.1 |
| 4,671,204 | 6/1987 | Ballou | 118/59 |
| 5,178,721 | 1/1993 | Sugino | 156/626 |

FOREIGN PATENT DOCUMENTS

| | | |
|---|---|---|
| 0301335A2 | 2/1989 | European Pat. Off. . |
| 63-115338 | 5/1988 | Japan . |
| 63-141316 | 6/1988 | Japan . |
| 63-155727 | 6/1988 | Japan . |
| 63-128630 | 7/1988 | Japan . |
| 63-174320 | 7/1988 | Japan . |
| 63-197338 | 8/1988 | Japan . |
| 63-291423 | 11/1988 | Japan . |
| 64-21926 | 1/1989 | Japan . |
| 64-32627 | 2/1989 | Japan . |
| 64-32633 | 2/1989 | Japan . |
| 2137664A | 10/1984 | United Kingdom . |

OTHER PUBLICATIONS

"Photoexcited Processes for Semiconductors II: Dry Cleaning and Dry Etching" by Sato, Sugino and Ito; Fujitsu Sci. Tech. J., 27, 4, pp. 317–328 (Dec. 1991).

*Primary Examiner*—Anthony McFarlane
*Assistant Examiner*—Nhat D. Phan
*Attorney, Agent, or Firm*—Charles E. Wands

[57] ABSTRACT

Wafer surface degradation in a photoexcitation dry cleaning process, due to volatilization of surface halides that allows the exposed silicon surface to be further etched, is obviated by controlling the conditions of the process, specifically silicon wafer surface temperature, such that silicon reaction products that are formed on the surface of the wafer in the presence of the photoexcited disassociated halogen radicals do not volatilize. The silicon wafer is placed upon a low temperature chuck. When the halogen gas within the reaction chamber is irradiated with ultraviolet light, it produces disassociated halogen atoms that react with the surface of said silicon. Irradiation of the halogen gas and the surface of the silicon wafer is controlled by an optical shutter, in order to limit the amount of ultraviolet radiation that strikes and is absorbed by the wafer. The reduced temperature of the wafer prevents volatilization of a surface film containing halogen-contaminant compounds and halogen-silicon reaction products. As a consequence, further reaction of the halogen reactant radicals with silicon underlying the surface film is effectively suppressed. Thereafter, the surface film is removed from the surface of the wafer, for example by increasing its temperature in halogen free chamber at a reduced pressure, or by dissolving the film in a rinse solution, such as water.

20 Claims, 2 Drawing Sheets

5,352,327

REDUCED TEMPERATURE SUPPRESSION OF VOLATILIZATION OF PHOTOEXCITED HALOGEN REACTION PRODUCTS FROM SURFACE OF SILICON WAFER

FIELD OF THE INVENTION

The present invention relates in general to the manufacture of semiconductor devices, and is particularly directed to a process for treating a silicon substrate surface which may contain a metal contaminant that is to be removed, without substantially etching the surface of said silicon substrate into a roughened condition.

BACKGROUND OF THE INVENTION

Photoexcited dry cleaning processes use highly purified halogen gas, such as chlorine gas, for ultraclean surface-treating of the surfaces of ultra large scale integrated circuits (for example, to remove metallic contaminants from the silicon surface). For this purpose, as diagrammatically illustrated in FIG. 1, which corresponds to FIG. 1 of an article entitled "Photoexcited Processes for Semiconductors II: Dry Cleaning and Dry Etching," by Y. Sato et al, Fujitsu Sci. Tech. J., 27,4,pp. 3-7-328 (Dec. 1991), the halogen gas that has been introduced into a chamber containing a (silicon) wafer to be treated is disassociated into highly active atomic halogen radicals by irradiating the gas with ultraviolet light. These reactive halogen radicals then react with the silicon and metal contaminants of the surface of the wafer to form metallic and silicon halides. Because the silicon wafer is exposed to the photoexciting ultraviolet light, its surface temperature increases, causing the contaminating metallic halides to volatilize (vaporize and lift-off), thereby purging the surface of the wafer of the metallic contaminants. Unfortunately, the silicon halides also volatilize off the wafer surface, causing unwanted etching of the underlying silicon, which leaves the surface of the wafer in a toughened condition that can be detrimental to device performance.

Efforts to limit this undesirable reaction between the halogen radicals and the silicon, such as described in the above mentioned Sato et al article, have included pretreating the surface of the wafer with selected solutions, in order reduce surface etching at elevated temperatures. Still, the silicon-halides are prone to volatilize, causing the wafer surface to be etched and left in a roughened condition.

SUMMARY OF THE INVENTION

In accordance with the present invention, the above described wafer surface degradation problem is successfully remedied by controlling the conditions of the photoexcitation dry cleaning process so as to effectively suppress the volatility of silicon reaction products that are formed on the surface of the wafer in the presence of the photoexcited disassociated halogen radicals.

For this purpose, rather than effect backside-heating of the silicon wafer, as by means of an infrared lamp, as described in the above-cited Sato et al article, the silicon wafer is contacted with (placed upon) a cooling medium, such as a low temperature chuck, which serves to reduce the temperature of the silicon wafer, rather than increase its temperature. When the halogen gas within the chamber is irradiated with ultraviolet light, so as to photoexcite the halogen gas to produce disassociated halogen atoms that react with the surface of the silicon, the reduced temperature of the wafer prevents volatilization of a surface film containing halogen-contaminant compounds and halogen-silicon reaction products. As a consequence, further reaction of the highly reactive halogen atoms with that portion of the silicon wafer underlying the surface film is effectively suppressed. Thereafter, the surface film that contains silicon-halogen and contaminant-halogen reaction products is removed from the surface of the wafer, for example by increasing its temperature in a halogen free chamber at a reduced pressure, or by dissolving the film in a rinse solution, such as water.

In a preferred embodiment of the invention, irradiation of the halogen gas and thereby the surface of the silicon wafer is modulated, for example by modulating the ultraviolet light source or by controllably opening and closing an optical shutter, in order to limit the amount of ultraviolet radiation that strikes and is absorbed by the wafer. Modulation of incident ultraviolet radiation permits the surface of the wafer to be maintained with a prescribed reduced temperature window, so that the halogen reaction-product film does not volatilize off the wafer surface.

DETAILED DESCRIPTION

As pointed out above, the improved photoexcitation dry cleaning process of the present invention effectively prevents unwanted degradation of the silicon wafer surface by controlling ambient conditions of the wafer within the photoexcitation chamber, so as to effectively suppress the volatility of silicon reaction products that are formed on the surface of the wafer in the presence of the photoexcited disassociated halogen radicals, In particular, rather than raise the temperature of the silicon wafer for the purpose of causing halogen reaction products to readily volatilize off ('clean') the wafer surface, the silicon wafer is maintained at a reduced temperature during the photoexcitation process, so as to prevent volatilization of the surface film containing halogen-contaminant compounds and halogen-silicon reaction products. Because the film does not volatilize off the wafer surface it will effectively suppress further reaction of the halogen reactant radicals with that portion of the silicon wafer substrate underlying the surface film. Thereafter, the surface film that contains silicon-halogen and contaminant-halogen reaction products is removed from the surface of the wafer.

Figure 2:
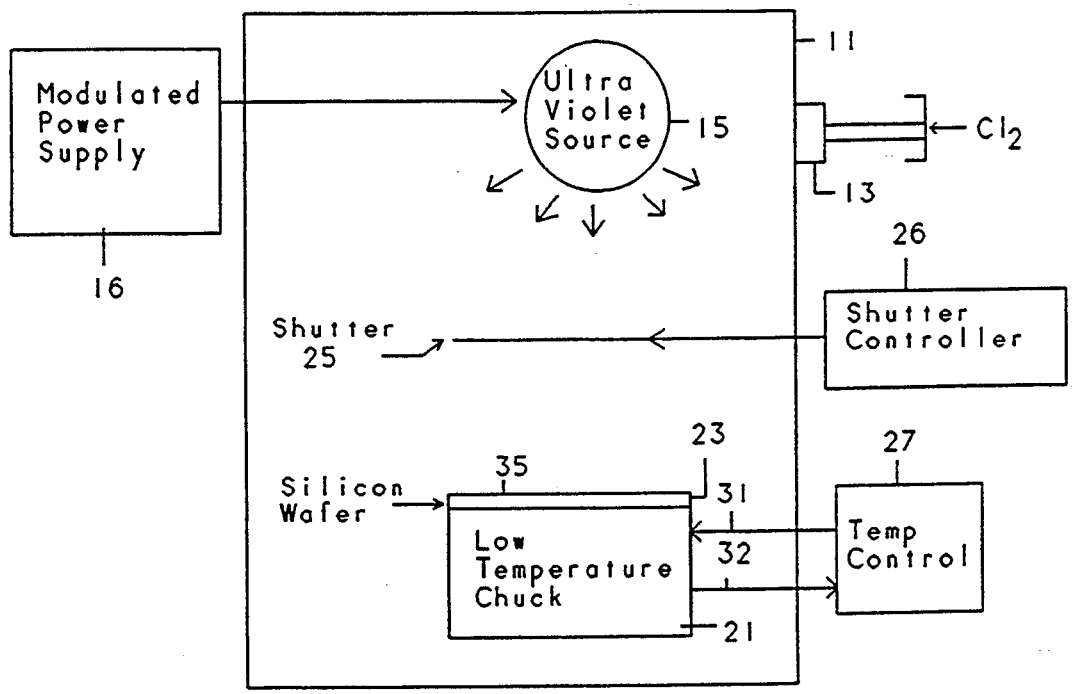
FIGS. 2 and 3 diagrammatically illustrate respective reaction chambers that may be used in the course of executing the photoexcitation dry cleaning process in accordance with an embodiment of the present invention.

FIG. 2 diagrammatically illustrates a controlled ambient reaction chamber 11 that may be used in the course of executing the photoexcitation dry cleaning process in accordance with an embodiment of the present invention. Chamber 11 has one or more reactant gas inlet ports 13 to which a halogen gas, such as chlorine or fluorine, is controllably supplied from a gas source. Disposed within chamber 11 is a reactant gas irradiation source, such as an ultraviolet (UV) lamp 15, which is preferably located above and facing a wafer support 21 upon which a semiconductor (silicon) wafer 23 to be treated is placed. An optical shutter 25 may be disposed between lamp 15 and wafer support 21, in order to modulate the amount of ultraviolet radiation incident upon wafer 23. Namely, optical shutter 25 is controllably opened and closed by means of a shutter controller 26 during the photoexcitation dry cleaning process, so as to controllably adjust the amount of radiation absorbed by wafer 23 and thereby maintain the temperature of wafer 23 within prescribed non-volatilizing limits. Alternatively, ultraviolet lamp 15 itself may be modulated, as by way of a modulated lamp power supply 16.

Wafer support 21 may take the form of a metallic chuck having cooling fluid supply and exhaust ports 31, 33 coupled to a fluid temperature controller 27 of in order to effectively cool or maintain the wafer 23 at a prescribed temperature, that is below the temperature at which halogen reaction products volatilize off the surface of the wafer. As a non-limitative example, wafer 23 may be a silicon wafer having a thickness of between 250 and 1,000 microns, with irradiation conditions of deep UV radiation with wavelengths in the range of 150 nm to 350 nm at power densities of 400 mW/cm$^2$ to 800 mW/cm$^2$. The chamber should be constructed of material compatible with the reactants and reaction by-products and capable of operating at pressures well above the vapor pressure of the M-Ci$_x$ or SiCl$_4$ by-product at the appropriate wafer temperature. The temperature of wafer 23, which is dependent upon the operational pressure of the chamber, may be maintained at a temperature less than 0° C., so that a photoexcited halogen reaction product film 35 formed on the surface of the wafer will not volatilize off the wafer.

In operation, a silicon substrate or wafer 23 is placed upon temperature controlled support chuck 21 and allowed to cool down to the surface temperature of the support chuck. A halogen gas, such as chlorine, is then introduced into chamber through inlet port 13, with the interior of chamber 11 pressure maintained at a pressure in excess of one atmosphere, as described above.

Figure 1:
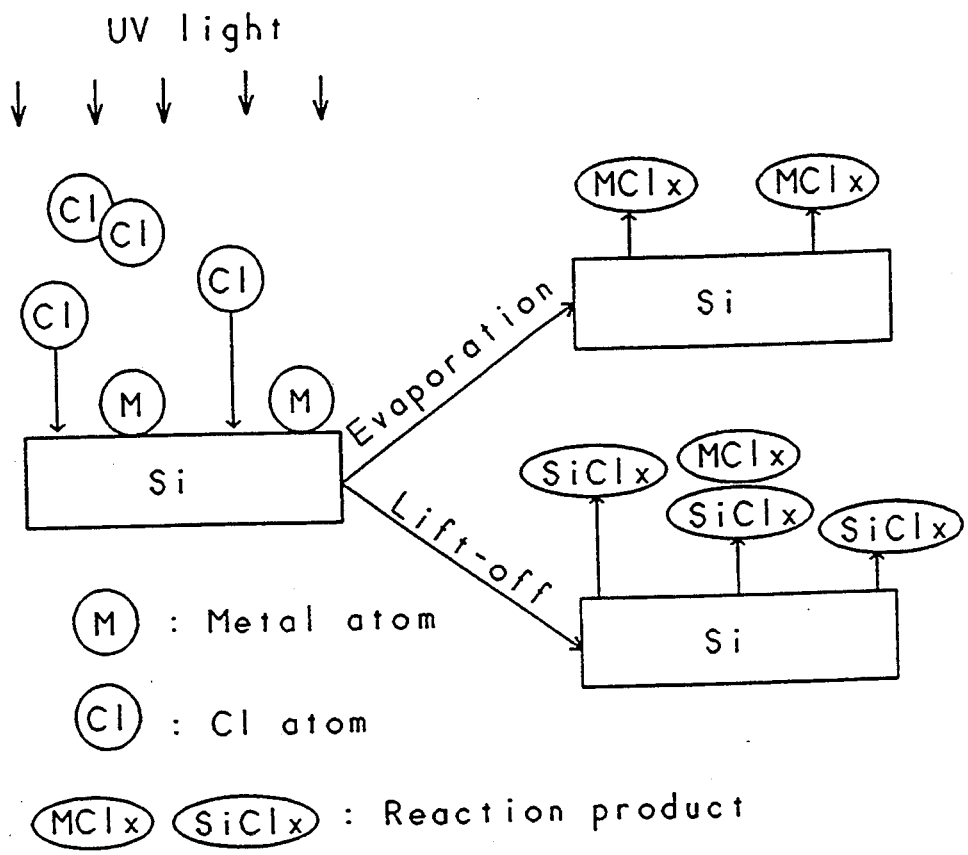
FIG. 1 is a diagrammatic illustration of an ultraviolet radiation-stimulated photoexcitation dry cleaning mechanism, as described in an article entitled "Photoexcited Processes for Semiconductors II: Dry Cleaning and Dry Etching," by Y. Sato et al, Fujitsu Sci. Tech. J., 27,4,pp. 3-7-328 (Dec. 1991)
Figure 4:
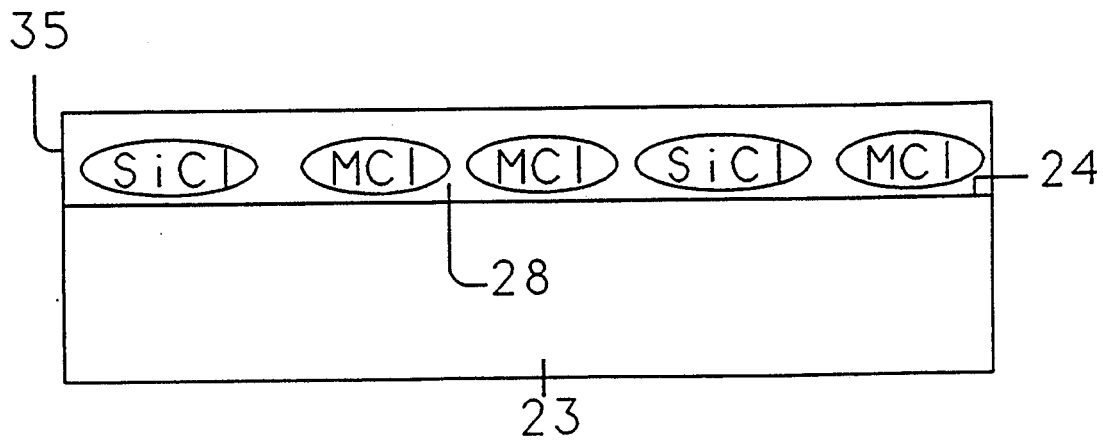
FIG. 4 diagrammatically shows, in enlarged detailed, the surface of a silicon wafer subjected to the reduced temperature photoexcitation dry cleaning process of the present invention.

Once the ambient conditions of the chamber have stabilized, ultraviolet lamp 15 is then energized, causing the ambient halogen gas (e.g. Cl) to be photo-disassociated into highly reactive atomic halogen radicals that impinge upon and react with the exposed surface 24 of the silicon substrate 23, including any contaminant (e.g. metal) material. As a result, the surface of the silicon substrate is converted into a thin halide film 35 (having a minimum thickness of one monolayer (approximately 0.2 nm), containing halogen-contaminant compounds and halogen-silicon reaction products, shown diagrammatically in FIG. 4.

Because of the reduced temperature of silicon substrate 23, the halogen reactant components that make up film 35 do not volatilize off the surface of the wafer, so that film 35 acts as a buffer layer between the photo-disassociated chlorine atoms and the underlying portion 28 of silicon wafer, and suppresses further reaction of the halogen reactant radicals with the silicon.

During the photoexcitation process, shutter 25 is controllably opened and closed, in order to regulate the amount of UV radiation to which the surface 24 of wafer 23 is exposed. This controlled shutter operation allows sufficient photoexcitation of the halogen gas, on the one hand, while preventing a significant increase (no greater than 10° C.) in the surface temperature of the silicon wafer.

Figure 3:
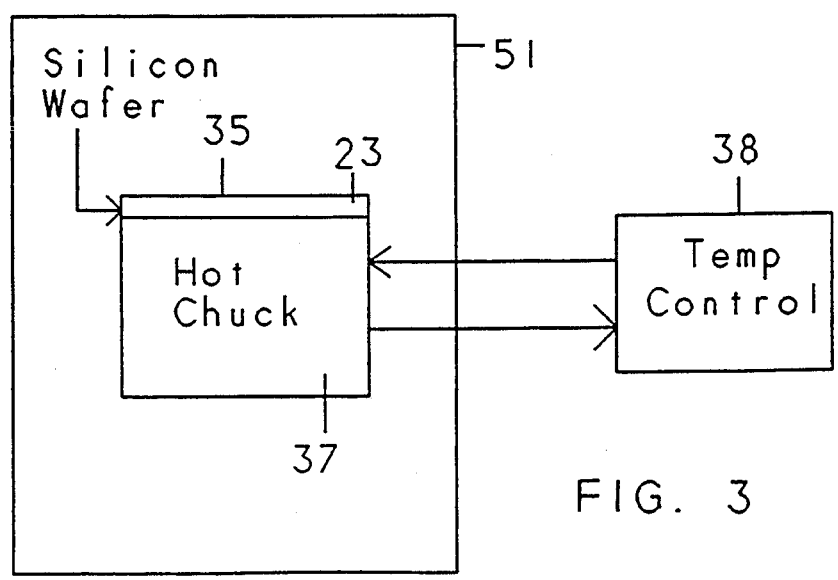

After a period of one to three minutes, ultraviolet lamp 15 is turned off, the halogen gas is purged and the film-coated wafer 23 is removed from chamber 11. It may then be placed in a second chamber 51, for example on a heating chuck 37 the temperature of which is controlled by a wafer support temperature controller 38, as shown in FIG. 3, in which the pressure is reduced to less than atmospheric pressure (for example, in a range on the order of approximately $10^{-6}$ Torr) and the temperature of wafer 23 is increased to 300° C., which causes halogen-contaminant and halogen-silicon reaction products within film 35 to be desorbed or volatilize off the surface of the silicon substrate and removed by an exhaust port (not shown). Alternatively, film 35 may be removed by exposing silicon substrate 23 to a rinse bath in which the halogen-contaminant and halogen-silicon reaction products are soluble, such as water, so as to wash film 35 off surface 24 of silicon substrate 21. The wafer is now left substantially contaminant-free, but without the roughness that would otherwise have been caused by reactive halogen atoms etching the silicon surface not protected by film 35.

As will be appreciated from the foregoing description, the problem of wafer surface degradation in a photoexcitation dry cleaning process, due to volatilization of surface halides that allows the exposed silicon surface to be further etched, is remedied in accordance with the present invention by controlling the conditions of the process, specifically silicon wafer surface temperature, such that silicon reaction products that are formed on the surface of the wafer in the presence of the photoexcited disassociated halogen radicals do not volatilize.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A process for removing contaminant material from a surface of a substrate without causing said surface of said substrate to become roughened comprising the steps of:

(a) placing said substrate in a controlled ambient chamber;
   (b) introducing a halogen gas into said chamber;
   (c) while maintaining said substrate at a temperature below a temperature at which halogen-substrate compounds on the surface of said substrate volatilize off said surface of said substrate, photoexciting said halogen gas to produce a halogen reactant that reacts with contaminant material on the surface of said substrate to produce halogen-contaminant compounds; and
   (d) removing halogen-substrate compounds that have been formed in step (c) from the surface of said substrate.

2. A method according to claim 1, wherein step (c) comprises placing said substrate in contact with a heat sink that effectively maintains the temperature of said substrate below said temperature at which halogen-substrate compounds volatilize off said surface of said substrate in the presence of photoexcitation of said halogen.

3. A method according to claim 1, wherein step (c) comprises maintaining the pressure of said chamber at a pressure above atmospheric pressure and irradiating said halogen gas with ultraviolet light, thereby photoexciting said halogen gas to produce a halogen reactant that reacts with contaminant material on the surface of said substrate to produce halogen-contaminant compounds, while maintaining said substrate in contact with a heat sink at a temperature below said temperature at which halogen-substrate compounds volatilize off the surface of said substrate.

4. A method according to claim 3, wherein said substrate comprises a silicon substrate and said halogen comprises chorine.

5. A method according to claim 3, wherein step (d) comprises increasing the temperature of said substrate upon said surface of which halogen-contaminant compounds have been formed, so as to volatilize said halogen-contaminant compounds off said surface of said substrate.

6. A method according to claim 5, wherein step (d) comprises placing said substrate in a reduced pressure atmosphere and increasing the temperature of said substrate upon said surface of which halogen-contaminant compounds have been formed, so as to volatilize said halogen-contaminant compounds off said surface of said substrate.

7. A method according to claim 3, wherein step (d) comprises exposing said substrate to a bath in which said halogen-contaminant compounds are soluble, so as to rinse said halogen-contaminant compounds off said surface of said substrate.

8. A method according to claim 3, wherein step (c) includes modulating the irradiation of the halogen gas and thereby modulating the irradiation of the surface of said silicon substrate, so as to controllably adjust the amount of radiation absorbed by said substrate and thereby maintain the temperature of the substrate below said temperature at which halogen-substrate compounds volatilize off said surface of said substrate.

9. A method according to claim 8, wherein step (c) includes controllably operating an optical shutter disposed between an ultraviolet light source and said substrate in order to modulate the amount of ultraviolet radiation incident upon said substrate.

10. A method according to claim 8, wherein step (c) includes controllably modulating an ultraviolet light source.

11. A process for removing contaminant material from a surface of a silicon substrate, without substantially etching the surface of said silicon substrate into a roughened condition, comprising the steps of:
(a) placing said silicon substrate in a controlled ambient chamber;
(b) introducing a halogen gas into said chamber at a pressure in excess of one atmosphere;
(c) while contacting said silicon substrate with a cooling medium that maintains said silicon substrate at a temperature below a temperature at which halogen-substrate compounds on the surface of said substrate volatilize off said surface of said substrate, irradiating said halogen gas with ultraviolet light, thereby photoexciting said halogen gas to produce halogen reactant radicals, that react with the surface of said silicon substrate, including contaminant material thereon, and convert the surface of said silicon substrate into a surface film containing halogen-contaminant compounds and halogen-silicon reaction products, but, because of the reduced temperature of said silicon substrate being maintained below said temperature at which halogen-substrate compounds volatilize off the surface of said substrate, volatilization of said surface film does not occur, so that further reaction of said halogen reactant radicals with that portion of said silicon substrate underlying said film is effectively suppressed; and
(d) removing said film that contains silicon-halogen and contaminant-halogen reaction products from the surface of said substrate.

12. A method according to claim 11, wherein said halogen comprises chlorine.

13. A method according to claim 11, wherein step (d) comprises placing said silicon substrate in a chamber the pressure of which is reduced to less than one atmosphere and increasing the temperature of said substrate upon said surface of which film has been formed, so as to volatilize said halogen-contaminant and halogen-silicon reaction products off said surface of said silicon substrate.

14. A method according to claim 11, wherein step (d) comprises exposing said silicon substrate to a bath in which said halogen-contaminant and halogen-silicon reaction products are soluble, so as to rinse said film off said surface of said silicon substrate.

15. A method according to claim 11, wherein step (c) includes modulating the irradiation of the halogen gas and thereby modulating the irradiation of the surface of said silicon substrate, so as to controllably adjust the amount of radiation absorbed by said substrate and thereby maintain the temperature of the substrate below said temperature at which halogen-substrate compounds volatilize off said surface of said substrate.

16. A method according to claim 15, wherein step (c) includes controllably operating an optical shutter disposed between an ultraviolet light source and said substrate in order to modulate the amount of ultraviolet radiation incident upon said substrate.

17. A method according to claim 15, wherein step (c) includes controllably modulating an ultraviolet light source.

18. A process for removing contaminant material from a surface of a silicon substrate, without substantially etching the surface of said silicon substrate into a roughened condition, comprising the steps of:
(a) placing said silicon substrate in a controlled ambient chamber;
(b) introducing a halogen gas into said chamber;
(c) while contacting said silicon substrate with a cooling medium that maintains said silicon substrate at a temperature below a temperature at which halogen-substrate compounds on the surface of said substrate volatilize off said surface of said substrate, forming a buffer layer on the surface of said substrate, said buffer layer containing halogen-substrate compounds including halogen-contaminant compounds, said buffer layer preventing further halogen reactants in said chamber from coming in contact with said reacting with said substrate, by irradiating said halogen gas with ultraviolet light, thereby photoexciting said halogen gas to produce reactant radicals, which reactant radicals react with the surface of said silicon substrate, including contaminant material thereon and convert the surface of said silicon substrate into said buffer layer containing halogen-contaminant compounds and halogen-silicon reaction products, but, because of the temperature of said silicon substrate being maintained below said temperature at which halogen-substrate compounds volatilize off the surface of said silicon substrate, volatilization of said buffer layer does not occur, so that further reaction of said halogen reactant radicals with that portion of said silicon substrate underlying said buffer layer is effectively suppressed; and (d) removing said buffer layer that contains silicon-halogen and contaminant-halogen reaction products from the surface of said silicon substrate.

19. A method according to claim 18 wherein step (c) includes modulating the irradiation of the halogen gas and thereby modulating the irradiation of the surface of said silicon substrate, so as to controllably adjust the amount of radiation absorbed by said substrate and thereby maintain the temperature of the substrate below said temperature at which halogen-substrate compounds volatilize off said surface of said substrate.

20. A method according to claim 18, wherein step (d) comprises placing said silicon substrate in a chamber the pressure of which is reduced to less than one atmosphere and increasing the temperature of said substrate upon said surface of which film has been formed, so as to volatilize said halogen-contaminant and halogen-silicon reaction products off said surface of said silicon substrate.

* * * * *